US012804907B2

(12) United States Patent
Lu et al.

(10) Patent No.: US 12,804,907 B2
(45) Date of Patent: Nov. 17, 2026

(54) ANTI-FERROELECTRIC MEMORY DEVICE

(71) Applicant: Taiwan Semiconductor Manufacturing Company LTD, Hsinchu (TW)

(72) Inventors: Chun-Chieh Lu, Taipel City (TW); Yu-Ming Lin, Hsinchu City (TW); Kuo-Chang Chiang, Hsinchu City (TW); Yu-Chuan Shih, Hsinchu City (TW); Huai-Ying Huang, Jhonghe City (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 591 days.

(21) Appl. No.: 18/202,541

(22) Filed: May 26, 2023

(65) Prior Publication Data

US 2024/0397725 A1 Nov. 28, 2024

(51) Int. Cl.
*H10D 64/00* (2025.01)
*G11C 5/06* (2006.01)
(Continued)

(52) U.S. Cl.
CPC ............. *H10B 51/20* (2023.02); *G11C 5/063* (2013.01); *H10D 30/0415* (2025.01); (Continued)

(58) Field of Classification Search
CPC ........ H10B 51/20; H10B 51/10; G11C 5/063; H10D 30/0415; H10D 30/701; H10D 64/033; H10D 64/689
(Continued)

(56) References Cited

U.S. PATENT DOCUMENTS 6,887,799 B1 * 5/2005 Li ........................... H10P 14/68 257/E21.208
10,978,129 B1 * 4/2021 Müller .................. G11C 11/223
(Continued)

FOREIGN PATENT DOCUMENTS

TW 201917870 A 5/2019
TW 202103308 A 1/2021
(Continued)

OTHER PUBLICATIONS

Taiwan Office Action Application No. 11320370050 Dated: Apr. 17, 2024.

*Primary Examiner* — Sheikh Maruf
(74) *Attorney, Agent, or Firm* — Lippes Mathias LLP

(57) ABSTRACT

A field-effect transistor (FET), selectively switchable between first and second states, includes: source and drain regions and a channel region disposed therebetween; a gate arranged to selectively receive a bias voltage which switches the FET between the first and second states; a memory structure between the gate and the channel region, structure including a first portion which is anti-ferroelectric and a second portion which is ferroelectric, both portions being polarized in a first direction when the FET is in the first state; and a depolarization dielectric layer disposed proximate to the memory structure. When the FET is set to the first state, the depolarization dielectric layer destabilizes a polarization of the second portion of the memory structure while maintaining a polarization of the first portion.

20 Claims, 16 Drawing Sheets

(51) Int. Cl.
*H10B 51/20* (2023.01)
*H10D 30/01* (2025.01)
*H10D 30/69* (2025.01)
*H10D 64/01* (2025.01)
*H10D 64/68* (2025.01)

(52) U.S. Cl.
CPC ......... *H10D 30/701* (2025.01); *H10D 64/033* (2025.01); *H10D 64/689* (2025.01)

(58) Field of Classification Search
USPC .......................................................... 257/295
See application file for complete search history.

(56) References Cited

U.S. PATENT DOCUMENTS

| | | | | |
|---|---|---|---|---|
| 2015/0041873 | A1* | 2/2015 | Karda | H10B 51/20 257/295 |
| 2016/0207761 | A1* | 7/2016 | Alam | B81B 7/02 |
| 2017/0178712 | A1* | 6/2017 | Van Houdt | G11C 11/223 |
| 2017/0256552 | A1* | 9/2017 | Schröder | G11C 11/1659 |
| 2018/0040711 | A1* | 2/2018 | Rondinelli | H10D 1/682 |
| 2019/0074295 | A1* | 3/2019 | Schröder | G11C 11/221 |
| 2019/0130957 | A1* | 5/2019 | Müller | G11C 11/221 |
| 2020/0211839 | A1* | 7/2020 | Salahuddin | H10D 64/685 |
| 2020/0287017 | A1* | 9/2020 | Chang | H10D 30/0415 |
| 2020/0303417 | A1* | 9/2020 | Teo | H10D 30/6758 |
| 2021/0005728 | A1* | 1/2021 | Cheng | H10D 64/689 |
| 2021/0118990 | A1* | 4/2021 | Jo | H10D 62/115 |
| 2021/0119050 | A1* | 4/2021 | Ho | H10D 30/6211 |
| 2021/0359101 | A1* | 11/2021 | Heo | H10D 64/689 |
| 2021/0399135 | A1* | 12/2021 | Polakowski | H10B 12/37 |
| 2022/0013353 | A1* | 1/2022 | Lu | H10D 64/033 |
| 2022/0122995 | A1* | 4/2022 | Ocker | H10B 51/30 |
| 2022/0139931 | A1* | 5/2022 | Ocker | G11C 11/2275 257/295 |
| 2022/0139932 | A1* | 5/2022 | Polakowski | H10B 51/30 257/295 |
| 2022/0139933 | A1* | 5/2022 | Noack | G11C 11/221 365/145 |
| 2022/0139937 | A1* | 5/2022 | Müller | H10B 53/30 257/295 |
| 2022/0376114 | A1* | 11/2022 | Müller | H10D 64/033 |

FOREIGN PATENT DOCUMENTS

| | | | |
|---|---|---|---|
| TW | 202232797 | A | 8/2022 |
| TW | 202310196 | A | 3/2023 |
| TW | 202316577 | A | 4/2023 |
| TW | 202318408 | A | 5/2023 |

* cited by examiner

ANTI-FERROELECTRIC MEMORY DEVICE

BACKGROUND

The following relates to the semiconductor arts, and in particular, to an anti-ferroelectric (AFe) memory or field-effect-transistor (FET) or other like AFe component, semiconductor devices including the same and/or methods of manufacturing therefor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features as shown in the accompany figures may be arbitrarily increased or reduced for clarity of discussion.

DETAILED DESCRIPTION

Figure 1A:
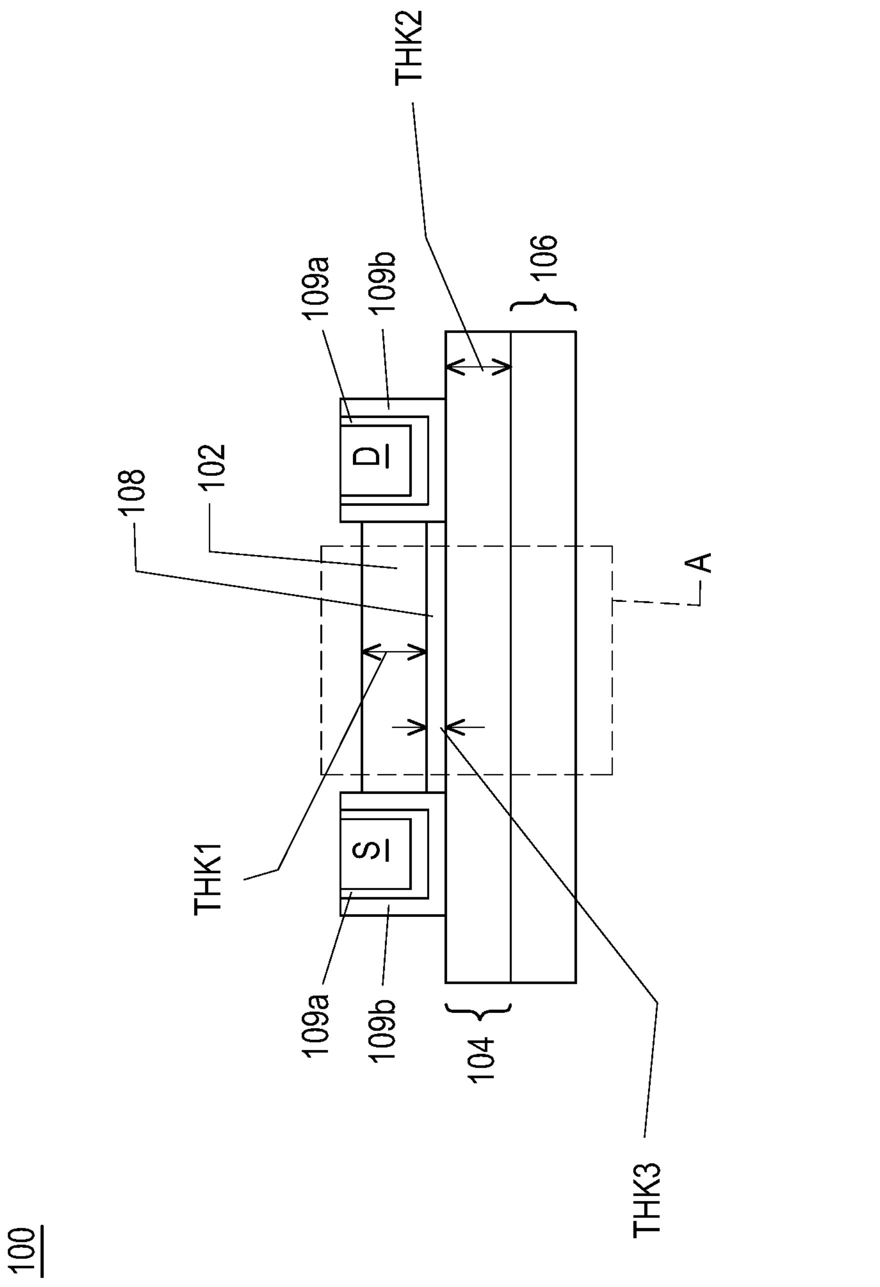
FIG. 1A diagrammatically illustrates a schematic cross section view taken at a channel region of a Fe/AFe-FET in accordance with some embodiments disclosed herein.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "left," "right," "side," "back," "rear," "behind," "front," "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In general, a Ferroelectric Random-Access Memory (FeRAM) device has a Metal/Ferroelectric/Metal (MFM) layer structure including a ferroelectric (Fe) layer arranged between top and bottom electrodes. The FeRAM may incorporate a ferroelectric field-effect-transistor (Fe-FET), which is a type of FET that includes a ferroelectric material sandwiched between a gate electrode and source-drain conduction region of the device (i.e., the channel). Electrical field polarization in the ferroelectric causes this type of device to generally retain the transistor's state (for example, on or off) in the absence of a sustaining electrical bias. A FeRAM device is a type of non-volatile Random-Access Memory (RAM) that is configured to store data values based on a process of reversible switching between polarization states which occurs due to the ferroelectric characteristic, namely that the crystal structure of the ferroelectric layer is capable of changing when an electric field is present. For example, in a FeRAM cell, when a first voltage bias (for example, a negative voltage bias) is applied to generate an electric field to which the Fe layer is subjected, atoms, dipoles or other constituents of the ferroelectric layer may be urged to shift into a first orientation, thereby inducing a first resistance indicating a first data value (for example, a logical '1'), whereas when a second different voltage bias (for example, a positive voltage bias) is applied to generate an electric field to which the Fe layer is subjected, atoms, dipoles or other constituents of the ferroelectric layer may be urged to shift into a second orientation (different from the first orientation), which induces a second resistance (different than the first resistance) indicating a second data value (for example, a logical '0').

FeRAM devices have a number of advantages. Being significantly resistant to power disruption and/or magnetic interference, the FeRAM is typically a reliable non-volatile memory. The FeRAM can exhibit low power usage, fast write performance, a high maximum read/write endurance, and/or long data retention times.

In accordance with some suitable embodiments, disclosed herein is a semiconductor memory device that employs a memory film comprising material having regions or domains exhibiting and/or possessing anti-ferroelectric (AFe) properties. Suitably, the memory film may also include regions or domains exhibiting and/or possessing ferroelectric (Fe) properties. In some suitable embodiments, the semiconductor memory device may be an Fe and/or AFe memory, for example, including an Fe and/or AFe field-effect-transistor (Fe/AFe-FET), with an oxide semiconductor as a channel material. In practice, the channel region of the field-effect-transistor (FET) may be disposed between respective source and drain regions of the FET and the memory film may be arranged proximate or near the channel region, for example, between a gate, gate electrode or other suitable gate structure and the channel or channel region of the FET.

In some suitable embodiments, the semiconductor memory device may be a type of non-volatile Random-Access Memory (RAM) that is configured to store data values based on a process of reversible switching between polarization states which occurs due to the Fe/AFe characteristic of the memory film. Suitably, the semiconductor memory device disclosed herein has a number of advantages. For example, it may be significantly resistant to power disruption and/or magnetic interference, and hence a reliable non-volatile memory. It may also exhibit low power usage, fast write performance, a high maximum read/write endurance, and/or long data retention times.

In some suitable embodiments, the memory layer may be Hafnium-Zirconium Oxide (HfZrO or HZO) film, with a relatively high percentage of Zr, for example, in a range of between about 50% Zr and about 80% Zr, inclusive. In practice, the memory film or layer may include crystalline structures and/or crystal grains of different phases and/or otherwise include regions that exhibit or possess Fe behavior (also referred to herein as the Fe domain of the memory film) and/or alternately AFe behavior (also referred to herein as the AFe domain of the memory film). For example, in an HZO memory film the orthorhombic phase (o-phase) generally exhibits or possesses Fe behavior and can represent the Fe domain, while the tetragonal phase (T-phase) generally exhibits or possesses AFe behavior and can represent the AFe domain. Advantageously, an increase in the Zr percentage of the HZO memory film generally increases the ratio of the AFe domain to non-AFe domain, however, the Fe domain still generally remains larger than the AFe domain.

In some suitable embodiments, by the application of a first bias voltage (for example, a positive bias voltage), the memory film or layer maybe selectively polarized and/or switched to a achieve a first state, nominally referred to herein as a program (PRG) state. Alternately, by the application of a second bias voltage (for example, a negative bias voltage), the memory film or layer may be selectively depolarized and/or switched to achieve a second state, nominally referred to herein as an erase (ERS) state. Advantageously, the incorporation of AFe materials and/or a significant AFe domain in the memory film or layer, for example, as opposed to strictly Fe materials and/or a Fe domain, can potentially suppress so-called weak erase issues, especially during endurance cycling, and achieve a well-controlled ERS state. For example, the AFe material and/or domain can suppress the weak ERS state issue due to a half butterfly polarization-voltage (PV) loop bias operation, as well as achieving better device performance and tightened data variation.

In some suitable embodiments, a depolarization dielectric layer is arranged proximate to one or both sides of the Fe/AFe memory film. In practice, employment of the depolarization dielectric layer has the advantage of helping to destabilize the PRG state polarization contribution from the Fe domain of the memory film, which would otherwise be too statable to effectively and/or efficiently disrupt or depolarize with the applied bias voltage intended for switching to the ERS state, which may be a relatively low magnitude bias. Suitably, in PRG state, the depolarization dielectric layer is used to generate a depolarization electric field in a direction generally opposite the polarization direction of the dipoles in the memory film (for example, in both the Fe and AFe domains). In this way, the polarization of the memory film (for example, in the Fe domain) is somewhat destabilized, while the polarization of the AFe domains is maintained, so that switching to the ERS state can be more easily and/or readily achieved, for example, with a relatively lower biasing or switching voltage as compared to when no depolarization dielectric layer is employed or present. In the ERS state, the depolarization electric field generated by the depolarization dielectric layer is zero or essentially nulled so as to not significantly impact the polarization state in AFe domain of the memory film, i.e., so that the polarization state in the AFe domain is zero or essentially zero and/or the dipoles therein have generally random polarization directions.

In accordance with some embodiments described herein, FIG. 1A shows a schematic cross-section view of an Fe/AFe-FET 100 taken at a channel region of the Fe/AFe-FET 100. In practice, the channel region is suitably disposed between a source region S and a drain region D of the Fe/AFe-FET 100. In one nonlimiting illustrative embodiment as shown in FIG. 1A, the source S and drain D may comprise an electrically conductive material such as tungsten coated with a tungsten glue layer 109*a* such as a titanium nitride (TiN) layer and a high carrier concentration layer 109*b* to reduce contact resistance.

In some suitable embodiments, the channel region may be formed and/or otherwise reside in an oxide semiconductor layer 102 of material, for example, without limitation, such as, zinc oxide (ZnO), indium tungsten oxide (InWO), indium gallium zinc oxide (InGaZnO), indium zinc oxide (InZnO), indium tin oxide (ITO), combination thereof or the like. In some suitable embodiments, the oxide semiconductor layer 102 may have a thickness THK1 in a range of between about 2 nanometers (nm) and about 20 nm, inclusive. In accordance with some suitable embodiments, the oxide semiconductor layer 102 may be suitably formed, for example, without limitation, by plasma vapor deposition (PVD), plasma enhanced chemical vapor deposition (PECVD), atomic layer deposition (ALD), plasma enhanced atomic layer deposition (PEALD) or another suitable material deposition technique.

As shown in FIG. 1A, in accordance with some suitable embodiments, a memory film or layer 104 is disposed between a gate electrode or gate 106 of the Fe/AFe-FET 100 and the oxide semiconductor layer 102. In some suitable embodiments, the gate electrode or gate 106 may be formed from and/or otherwise comprise a metal, alloy or other suitable electrically conductive material. For example, without limitation, the gate electrode or gate 106 may be a polysilicon material, a silicide material, metal composites, such as tungsten nitride (WN), titanium nitride (TiN), or tantalum nitride (TaN), a metal, such as aluminum (Al), combination and/or alloys thereof and/or the like.

In some suitable embodiments, the memory film or layer 104 is formed from and/or comprises an AFe material, for example, including a significant AFe domain portion in addition to an Fe domain portion and/or non-AFe domain portion. In some suitable embodiments, the AFe domain portion accounts for in a range of between about 2% and about 14%, inclusive, of the memory film or layer 104 and the Fe domain portion accounts for in a range of between about 88% and about 84%, inclusive, of the memory film or layer 104, which was experimentally found to provide best performance. In practice, the remaining percentage of the memory film or layer 104 may be non-AFe domain material, for example, having a non-AFe crystalline phase. In some suitable embodiments, the memory film or layer 104 may be formed from and/or comprise, for example, without limitation, HZO, hafnium aluminum oxide (HfAlO), hafnium lanthanum oxide (HfLaO), hafnium cerium oxide (HfCeO), hafnium oxide (HfO), hafnium gadolinium oxide (HfGdO), hafnium silicon oxide (HfSiO), combination thereof or the like. Suitably, for example, where the memory film or layer 104 is HZO, the zirconium (Zr) may be in a range of between about 50% and about 80%, inclusive, which was experimentally found to provide best performance. In some suitable embodiments, the memory film or layer 104 may have a thickness THK2 in a range of between about 2 nm and about 20 nm, inclusive. In accordance with some suitable embodiments, the memory film or layer 104 may be suitably formed, for example, without limitation, via plasma vapor deposition (PVD), plasma enhanced chemical vapor deposition (PECVD), atomic layer deposition (ALD), plasma enhanced atomic layer deposition (PEALD) or another suitable material deposition technique.

In accordance with some suitable embodiments, a depolarization dielectric layer 108 may be formed and/or disposed adjacent or otherwise proximate to (e.g., in contact with) a first side of the memory film or layer 104, for example, near the channel region of the Fe/AFe-FET 100. As shown in FIG. 1A, the depolarization dielectric layer 108 is disposed on the channel side of the memory film or layer 104, i.e., between the oxide semiconductor layer 102 and the memory film or layer 104. In some suitable embodiments, the depolarization dielectric layer 108 may be formed from and/or comprise, for example, without limitation, aluminum oxide ($Al_2O_3$), hafnium oxide ($HfO_2$), zirconium oxide ($ZrO_2$), combination thereof or the like. In some suitable embodiments, the depolarization dielectric layer 108 may have a thickness THK3 in a range of between about 0.1 nm and about 2 nm, inclusive. (Note that the depolarization dielectric layer 108 may be a discontinuous layer, in which case the thickness is an effective thickness representing the average thickness of the layer). It was experimentally found that for values of THK3 greater than about 2 nm, the time-zero (or initial state) ferroelectric properties such as memory window, are significantly degraded. Without being limited to any particular theory of operation, it is believed that this may be due to the phase of the HZO being changed if the thickness THK3 of the depolarization dielectric layer 108 exceeds about 2 nm. In accordance with some suitable embodiments, the memory film or layer 104 may be suitably formed, for example, without limitation, via plasma vapor deposition (PVD), plasma enhanced chemical vapor deposition (PECVD), atomic layer deposition (ALD), plasma enhanced atomic layer deposition (PEALD) or another suitable material deposition technique.

Figure 1B:
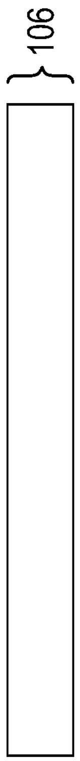
FIGS. 1B-IF are a sequence of cross-sectional views for fabricating the Fe/AFe-FET in accordance with some embodiments disclosed herein.

With reference to FIGS. 1B-IF, a fabrication sequence for fabricating the Fe/AFe-FET 100 of FIG. 1A are shown by way of a sequence of cross-sectional views. FIG. 1B shows the gate electrode or gate 106. As previously noted, the gate electrode or gate 106 may comprise a metal, alloy or other suitable electrically conductive material. For example, without limitation, the gate electrode or gate 106 may be a polysilicon material, a silicide material, metal composites, such as tungsten nitride (WN), titanium nitride (TiN), or tantalum nitride (TaN), a metal, such as aluminum (Al), combination and/or alloys thereof and/or the like. In some embodiments, the gate electrode or gate 106 may comprise a patterned electrically conductive layer formed in a metallization stack as part of back end-of-line (BEOL) or middle end-of-line (MEOL) processing.

Figure 1C:
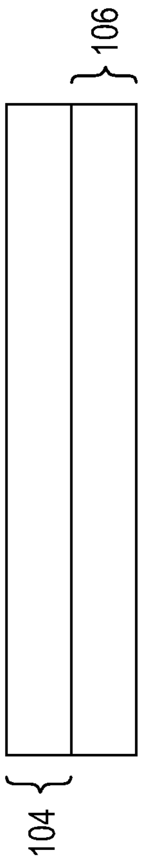

FIG. 1C shows the memory film or layer 104 is disposed on the gate electrode or gate 106. As detailed previously, the memory film or layer 104 may in some nonlimiting illustrative embodiments comprise Hafnium-Zirconium Oxide (HfZrO or HZO) film, with a relatively high percentage of Zr, for example, in a range of between about 50% Zr and about 80% Zr, inclusive. While HZO is described as an illustrative embodiment, it is contemplated that the memory film or layer 104 may comprise another type of ferroelectric material such as $SrBi_2Ta_2O_9$, $PbZr_xTi_{1-x}O_3$, or $BaTiO_3$.

Figure 1D:
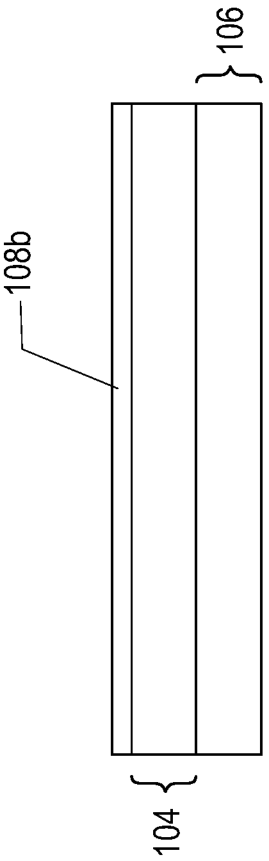

FIG. 1D shows the further formation of the depolarization dielectric layer 108*b* on the memory film or layer 104. In the illustrative example, the depolarization dielectric layer 108*b* is disposed on at least a portion of the memory film or layer 104. As previously described, the depolarization dielectric layer 108 may for example be an $Al_2O_3$, $HfO_2$, $ZrO_2$, or other layer having a thickness in the range 0.1 nm to 2 nm, and in some embodiments may be a discontinuous layer. As previously noted, this deposition may employ PVD, PECVD, ALD, PEALD, or another suitable material deposition technique. In the illustrative example, the depolarization dielectric layer 108*b* is formed as a blanket layer 108*b*, which will be patterned together with the oxide semiconductor layer 102 (see next FIG. 1E).

Figure 1E:
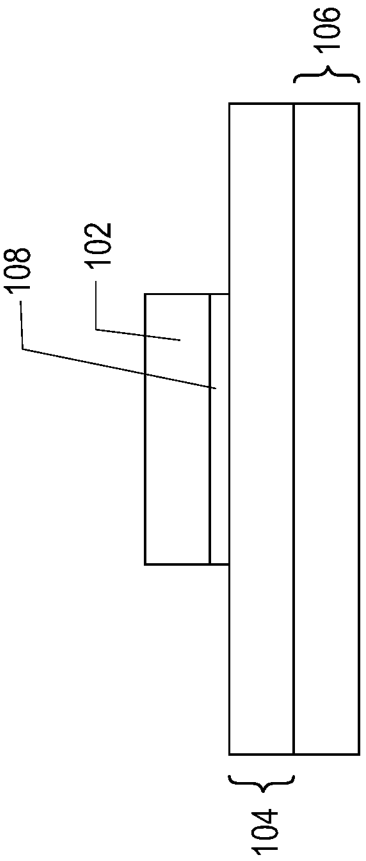

FIG. 1E shows oxide semiconductor layer 102 disposed on the depolarization dielectric layer 108 and photolithographically patterned. As previously discussed, the oxide semiconductor material of the oxide semiconductor layer 102 may comprise ZnO, InWO, InGaZnO, InZnO, ITO, combination thereof or the like, and may be formed by a deposition technique such as PVD, PECVD, ALD, PEALD, or so forth. In the illustrative approach of FIGS. 1D and 1E, the two layers 108 and 102 are suitably deposited as blanket layers, followed by photolithographic processing to pattern the depolarization dielectric layer 108 and oxide semiconductor layer 102 as shown in FIG. 1E. This is merely an illustrative example, and other approaches can be used, such as photolithographic patterning to define openings within which these layers are deposited.

Figure 1F:
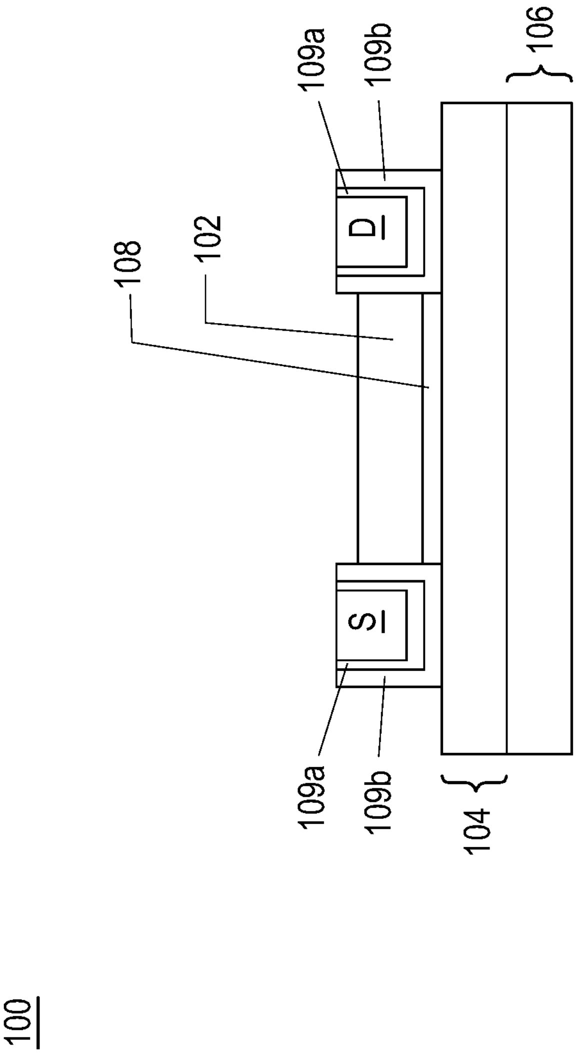

FIG. 1F shows the final Fe/AFe-FET 100 provided by formation of the source S and drain D. In the illustrative example in which the source S and drain D comprise tungsten (W), this entails forming the high carrier concentration layer 109*b* to reduce contact resistance and the tungsten glue layer 109*a*. Suitable photolithographic processing may be performed to delineate the areas of the source and drain S and D.

In addition to the fabrication steps outlined above as a nonlimiting illustrative example, the formation process for forming the Fe/AFe-FET 100 may include a thermal annealing step to produce ferroelectric crystallization of the memory film or layer 104. Using HZO as an example, a ferroelectric phase of HZO is the orthorhombic phase, which is able to provide a ferroelectric response as a consequence of its non-centrosymmetric crystal structure. However, the as-deposited memory film or layer 104 may be amorphous, or may have a mixture of phases, e.g. a mixture of tetragonal and/or monoclinic and/or orthorhombic crystal phases. Characterization techniques such as X-ray diffraction (XRD) and/or electron backscatter diffraction (EBSD) can be used to assess the fractional phases of the layer 104. If an insufficient portion of the as-deposited memory film or layer 104 is in a ferroelectric phase, then ferroelectric phase crystallization can be obtained spontaneously by annealing at a suitably high temperature for a sufficient time interval (e.g., ~550° C. for about 5 minutes may be sufficient in some cases). Such a thermal anneal may typically be performed any time after formation of the memory film or layer 104, with the timing of the anneal in the overall process flow being selected based on factors such as sensitivity of subsequently formed layers or structures to the annealing and convenience (e.g., in a three-dimensional array structure of Fe/AFe-FET's 100 such as that of FIG. 7, it may be beneficial to perform a single ferroelectric phase crystallization anneal after fabrication of the entire three-dimensional array structure).

Figure 3:
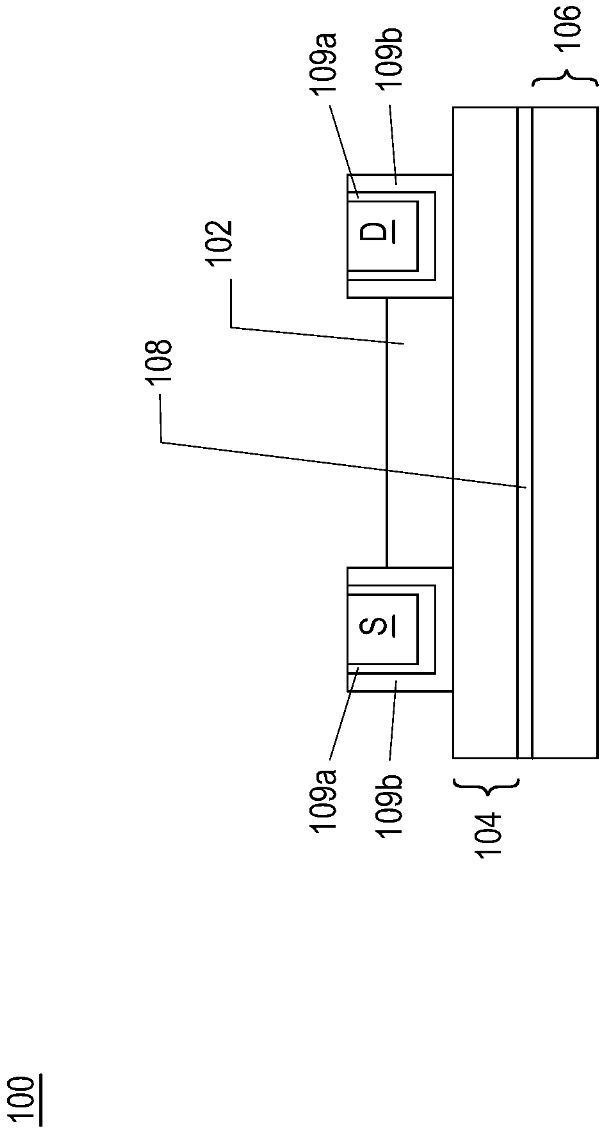
FIG. 3 diagrammatically illustrates a schematic cross section view taken at a channel region of a Fe/AFe-FET in accordance with an alternate embodiment disclosed herein.
Figure 4:
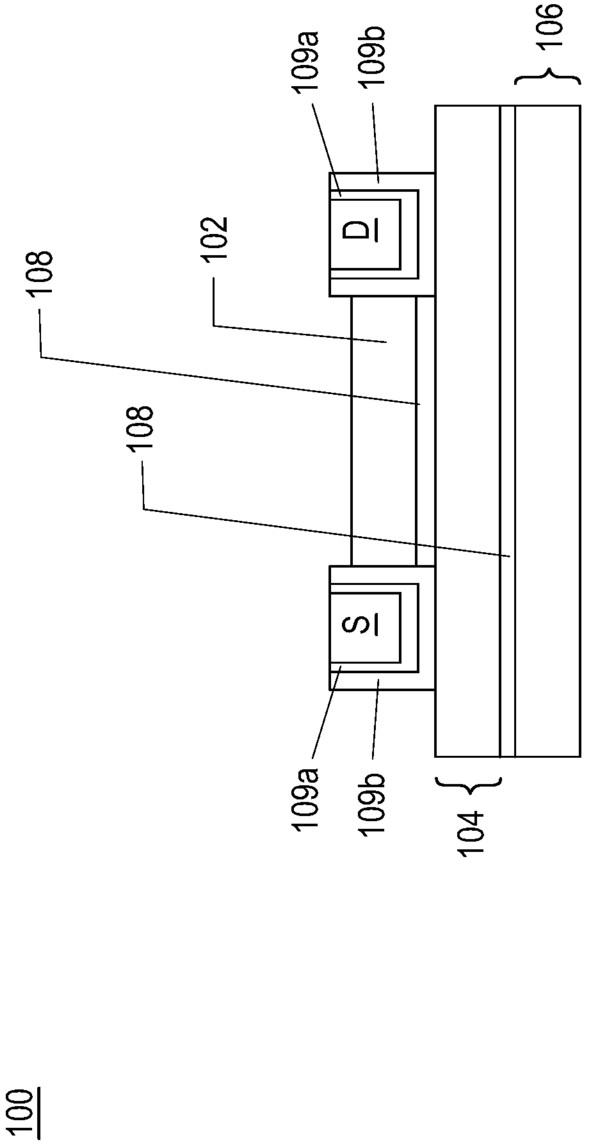
FIG. 4 diagrammatically illustrates a schematic cross section view taken at a channel region of a Fe/AFe-FET in accordance with another alternate embodiment disclosed herein.

In accordance with some embodiments disclosed herein, FIGS. 3 and 4 show some alternative configurations of the Fe/AFe-FET 100 shown in FIG. 1A. For example, as shown in FIG. 3, the depolarization dielectric layer 108 may be formed and/or disposed adjacent or otherwise proximate to (e.g., in contact with) a second side of the memory film or layer 104. More specifically, as shown in FIG. 3, the depolarization dielectric layer 108 is disposed on the gate side of the memory film or layer 104, i.e., between the gate electrode or gate 106 and the memory film or layer 104. As shown in FIG. 4, depolarization dielectric layers 108 may be formed and/or disposed adjacent, in contact with, or otherwise proximate to both sides of the memory film or layer 104. More specifically, as shown in FIG. 4, a first depolarization dielectric layer 108 is disposed on the channel side of the memory film or layer 104, i.e., between the oxide semiconductor layer 102 and the memory film or layer 104; and a second depolarization dielectric layer 108 is disposed on the gate side of the memory film or layer 104, i.e., between the gate electrode or gate 106 and the memory film or layer 104.

Figure 2:
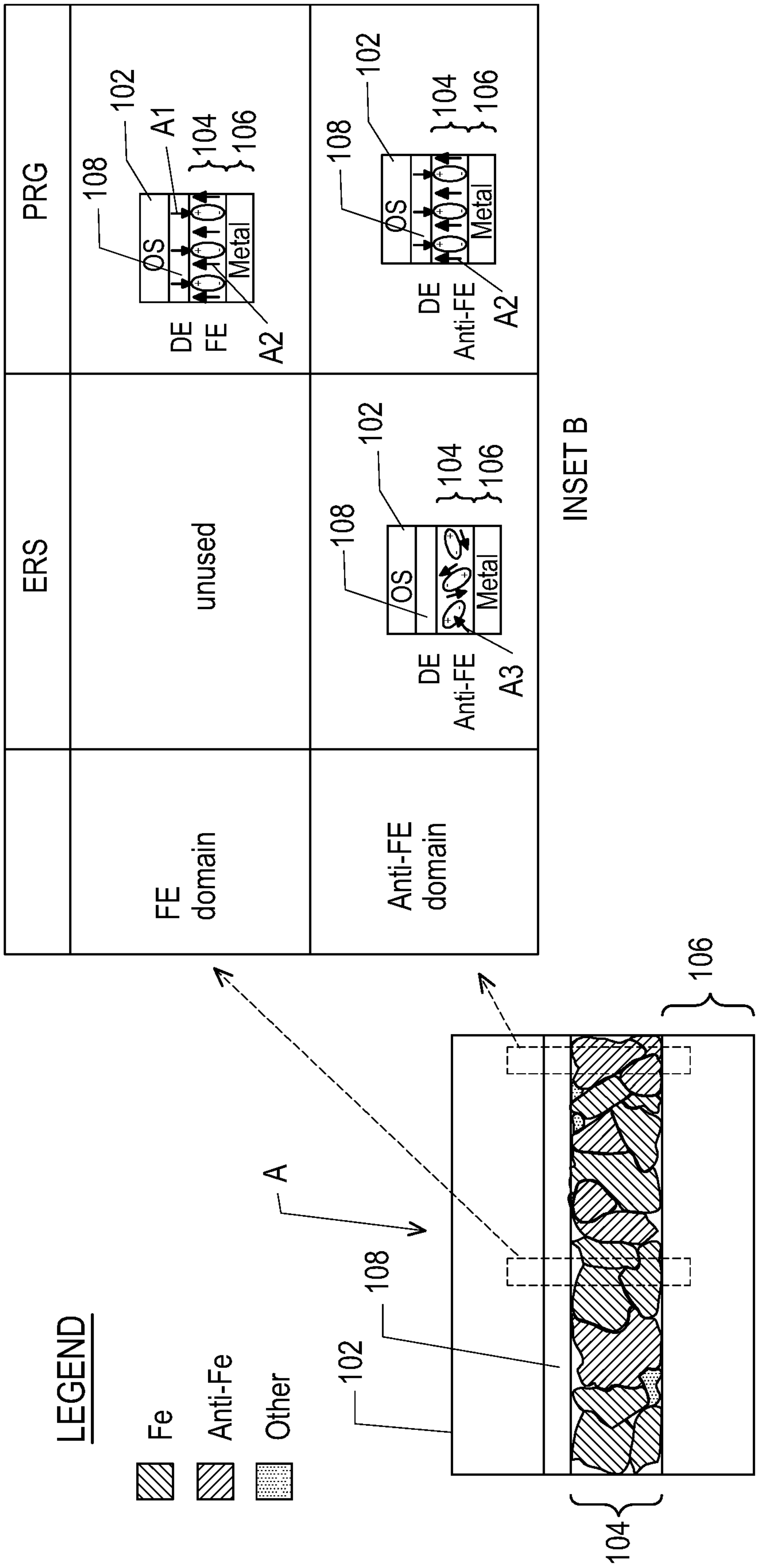
FIG. 2 diagrammatically illustrates an enlarged view of an identified region shown in FIG. 1A.

With attention now to FIG. 2, there is shown a magnified and/or enlarged view of a region A identified in FIG. 1A. As shown in FIG. 2, the memory film or layer 104 may have a crystalline structure, for example, including grains or portions or the like which represent the AFe domain and grains or portions or the like which represent the Fc domain. Suitably, in embodiments where the memory film or layer 104 is HZO, the AFe domain may be represented by T-phase grains or portions and/or a T-phase crystalline structure and the Fe domain may be represented by O-phase grains or portions and/or an O-phase crystalline structure.

Inset B of FIG. 2 is a table showing both of the respective operational states (i.e., the PRG state and the ERS state) in both the AFe domain and Fe domain of the memory film or layer 104. As can be seen in the PRG column of the table, the depolarization dielectric layer 108 generates an electric field in a direction (for example, indicated by the arrows A1 shown in the depolarization dielectric layer 108) which is generally opposite a polarization direction and/or alignment of the dipoles in the Fe and AFe domains (for example, indicated by the arrows A2 shown in the memory film or layer 104). As can be seen in the ERS column of the table, the depolarization dielectric layer 108 does not generate a significant electrical field or generates no electrical field (for example, as indicated by the lack of arrows being shown in the depolarization dielectric layer 108). Accordingly, in the AFe domain, the polarization is zeroed or null or essentially zero, i.e., the dipoles are essentially random or randomly aligned (for example, as indicated by the arrows A3 shown in the memory film or layer 104 pointing in multiple different directions).

Figure 5:
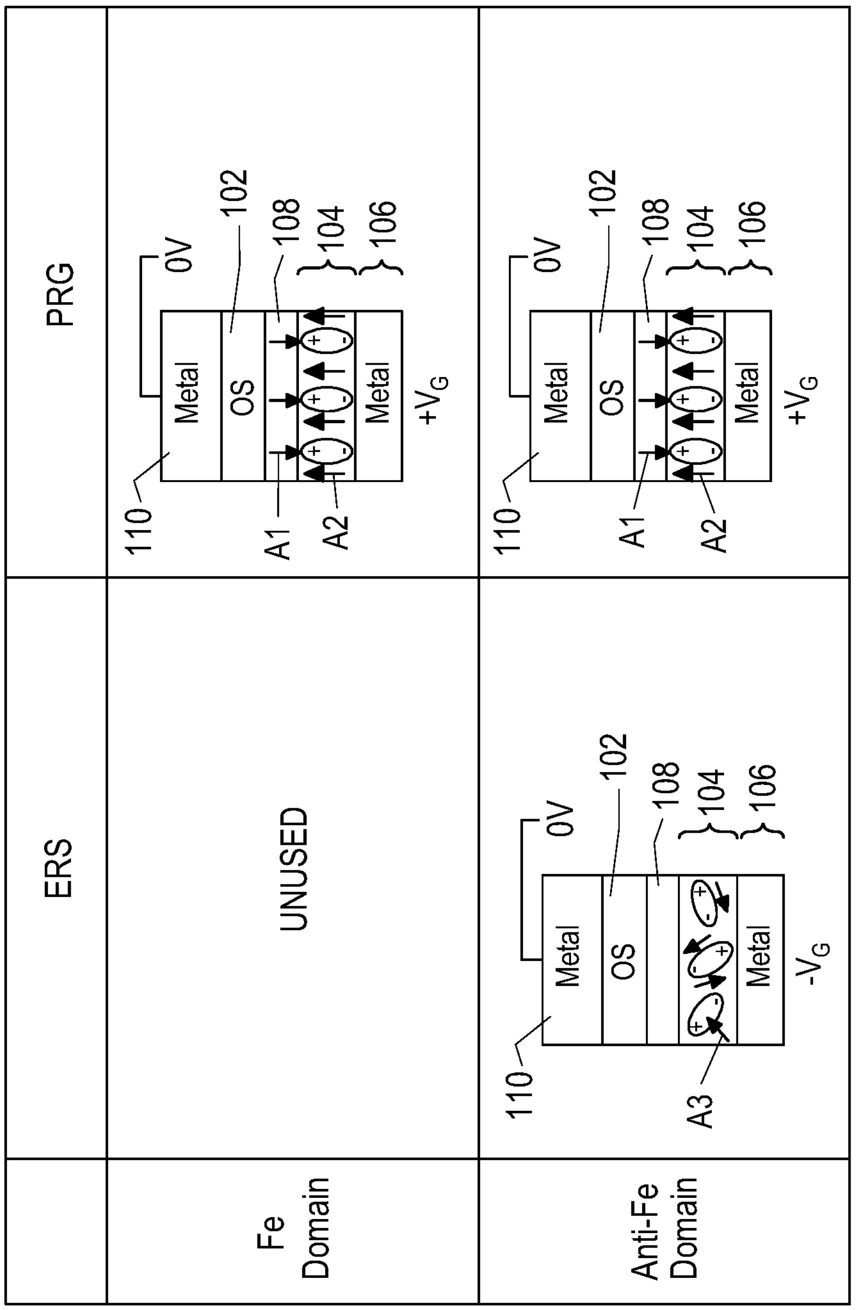
FIG. 5 is a table having diagrammatic illustrations therein of schematic cross section views taken at a source/drain region of an Fe/AFe-FET in accordance with some embodiments disclosed herein, showing respective program (PRG) and erase (ERS) states and the corresponding polarizations of Fe and AFe domain portions of a memory structure in the respective states.

FIG. 5 shows another version of the table shown in Inset B of FIG. 2. In FIG. 5, a schematic cross-section view is shown at a source and/or drain region of the Fe/AFe-FET 100. As shown, in accordance with some suitable embodiments, a metal or other suitably electrically conductive material layer 110 may represent a terminal for providing electrical access to source/drain of the Fe/AFe-FET 100. In some suitable embodiments, as shown in the PRG state column of the table, a first bias voltage ($+V_G$) may be applied, for example, via the gate electrode or gate 106. Alternatively, as shown in the ERS state column of the table, a second bias voltage ($-V_G$) may be applied, for example, via the gate electrode or gate 106. Again, as can be seen in the PRG column of the table, the depolarization dielectric layer 108 generates an electric field in a direction (for example, indicated by the arrows A1 shown in the depolarization dielectric layer 108) which is generally opposite a polarization direction and/or alignment of the dipoles in the Fe and AFe domains (for example, indicated by the arrows A2 shown in the memory film or layer 104). As can be seen in the ERS column of the table, the depolarization dielectric layer 108 does not generate a significant electrical field or generates no electrical field (for example, as indicated by the lack of arrows being shown in the depolarization dielectric layer 108). Accordingly, in the AFe domain, the polarization is zeroed or null or essentially zero, i.e., the dipoles are essentially random or randomly aligned (for example, as indicated by the arrows A3 shown in the memory film or layer 104 pointing in multiple different directions).

Returning attention to FIG. 1A, in some suitable embodiments, the thickness THK3 of the depolarization dielectric layer 108 may be in a range of between about 0.1 nm and about 2 nm, inclusive (where again the thickness THK3 could be an effective thickness of a discontinuous layer in some instances). In practice, a magnitude of the electric field generated by the depolarization dielectric layer 108 will be equal to the voltage drop ($V_{DE}$) across the depolarization dielectric layer 108 divided by THK3, i.e., $V_{DE}$/THK3.

Figure 6:
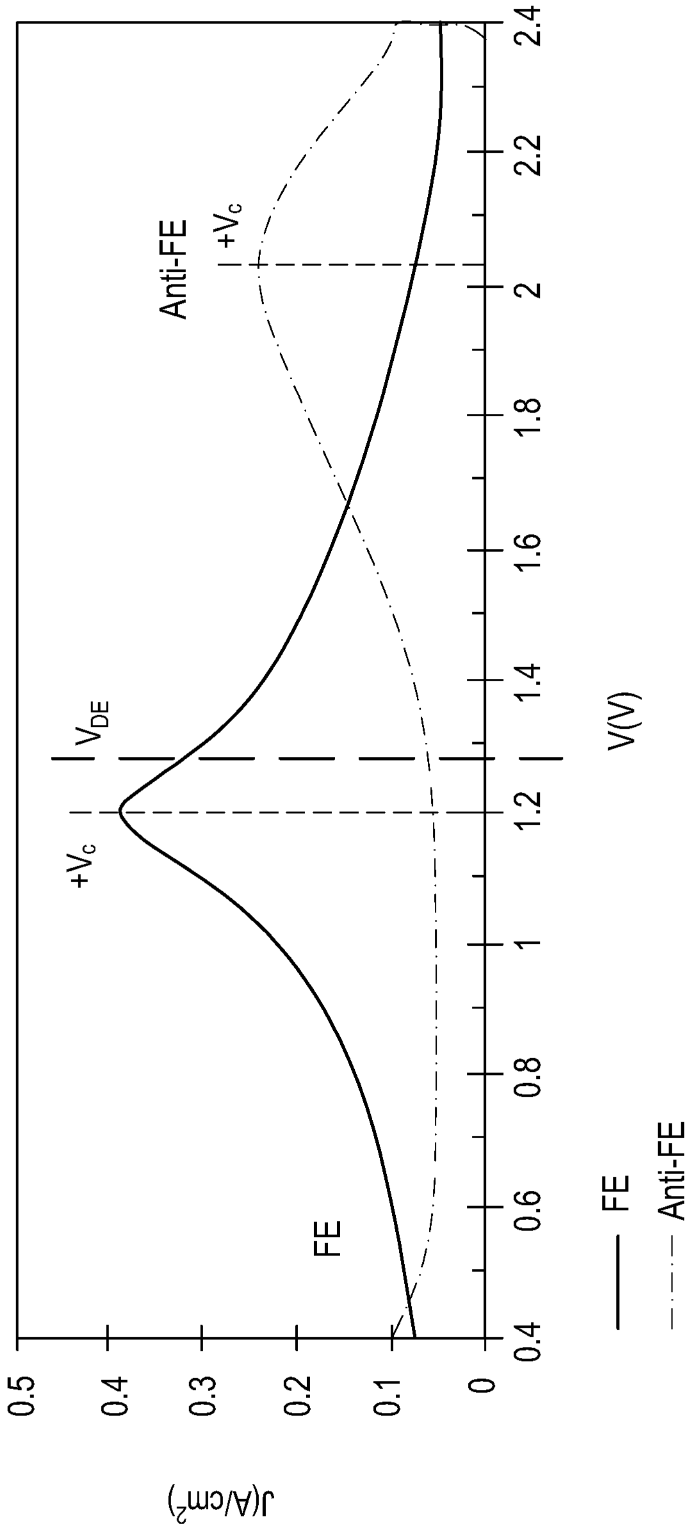
FIG. 6 shows a graph having switching current-voltage (IV) curves for respective Fe and AFe domains in accordance with some suitable embodiments of an Fe/AFe-FET disclosed herein.

FIG. 6 shows switching current IV curves for the respective Fe and AFe domains of the memory film or layer 104. In FIG. 6, the voltage V is plotted along the x-axis of the graph in volts (V) and the current J is plotted along the y-axis of the graph. As shown, a control voltage $+V_C$ for each of the Fe and AFe domains is indicated. In one nonlimiting illustrative example, for the Fe domain, $+V_C$ is around 1.0-1.4 V, while for the AFe domain, it is around 1.8-2.2 volts. In accordance with some suitable embodiments, the thickness THK3 of the depolarization dielectric layer 108 is suitably optimized and/or otherwise selected so that under the PRG bias of $+V_G$, the voltage drop $V_{DE}$ across the depolarization dielectric layer 108 is made to be less than $+V_C$ for the AFe domain and greater than but sufficiently close to $+V_C$ for the Fe domain, for example, around 1.1-1.5 V. Advantageously, a depolarization dielectric layer 108 of the appropriate thickness THK3 in this way has the potential to control a depolarization effect occurring in the Fe domain (e.g., to destabilize the polarization of the Fe domain), while maintaining the PRG state in the AFe domain.

Figure 7:
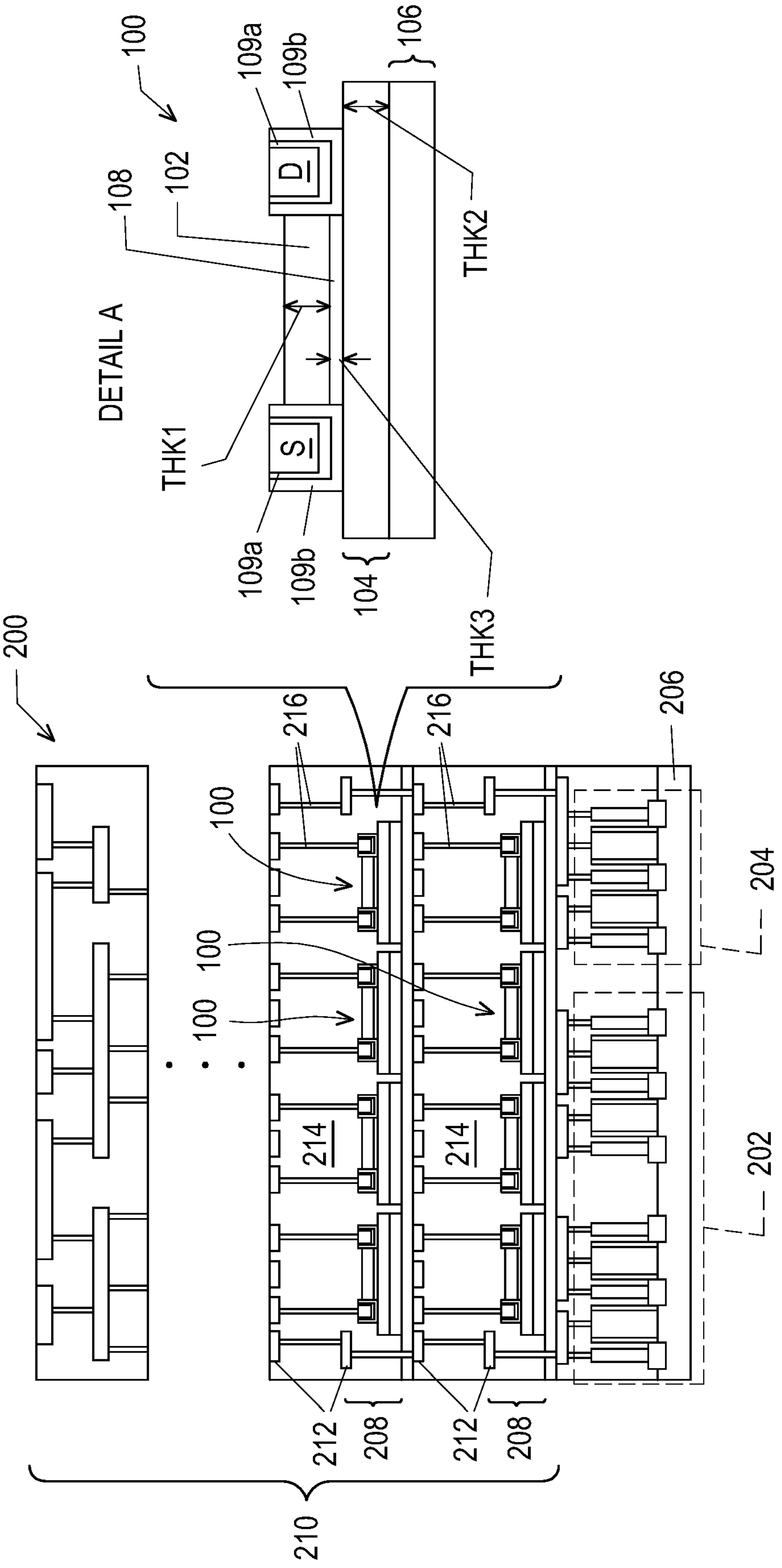
FIG. 7 diagrammatically illustrates an integrated circuit (IC) in which there is embedded and/or incorporated an Fe/AFe-FET in accordance with some suitable embodiments disclosed herein.

With reference now to FIG. 7, in some suitable embodiments, the Fe/AFe-FET 100 may be readily embedded and/or incorporated as a memory device in an integrated circuit (IC) 200 or a chip or the like. In the illustrative example of FIG. 7, the IC 200 may suitably include one or more logic devices 202 or the like, for example, without limitation, such as a static random access memory (SRAM) and/or one or more or other devices or components 204, for example, without limitation, such as peripherals, input/output components, analog components, etc. In one nonlimiting illustrative example, the one or more logic devices 202 and/or other devices or components 204 may be formed in and/or on a silicon substrate 206 during front end-of-line processing on a silicon substrate 206.

As further shown in FIG. 7, the IC 200 may further include a three-dimensional (3D) memory array with a plurality of stacked memory cells comprising Fe/AFe FET devices 100. In some suitable embodiments, each Fe/AFe FET layer 208 comprises a two-dimensional array of Fe/AFe FET devices 100 (where only one dimension is visible in the side-sectional view of FIG. 7). The Fe/AFe FET layers 208 are integrated or embedded in a multilayer metallization 210 fabricated during middle end-of-line (MEOL) and/or back end-of-line (BEOL) processing, The multilayer metallization 210 includes patterned metal layers 212 spaced apart by intermetal dielectric (IMD) material 214. Interlayer vias 216 pass through the IMD material 214 to provide electrical interconnectivity between the patterned metal layers 212. The patterned metal layers 212 suitably define or form electrical traces that along with the connecting vias 216 provide electrical connections between the logic devices 202, other devices, 204, and Fe/AFe FET devices 100, in accordance with the design of the IC 200. The 3D memory array comprising the Fe/AFe FET devices 100 can advantageously provide the IC 200 with high density embedded memory with reduced fabrication complexity compared with some other embedded memory designs such as those whose cells comprise FeRAM capacitors driven by separate transistors. Detail A of FIG. 7 shows an enlarged sectional view of one Fe/AFe FET device 100, e.g. corresponding to the device previously described with reference to FIG. 1A. Inclusion of the depolarization dielectric layer 108 in the Fe/AFe FET devices 100 of the 3D embedded memory, as indicated in Detail A, provides the Fe/AFe FET cells 100 of the 3D embedded memory with advantages as previously discussed, such as improved switching from the PRG state to the ERS state and/or lower biasing or switching voltage as compared to when no depolarization dielectric layer is employed. Suitably, the patterned metal layers 212 may include word and/or bit lines for reading and writing the Fe/AFe FET cells 100 of the 3D embedded memory array. By way of nonlimiting illustration, the word lines may connect with the gates 106 of the Fe/AFe FETs 100 and the bit lines may connect to the sources or drains of the Fe/AFe FETs 100.

Figure 8A:
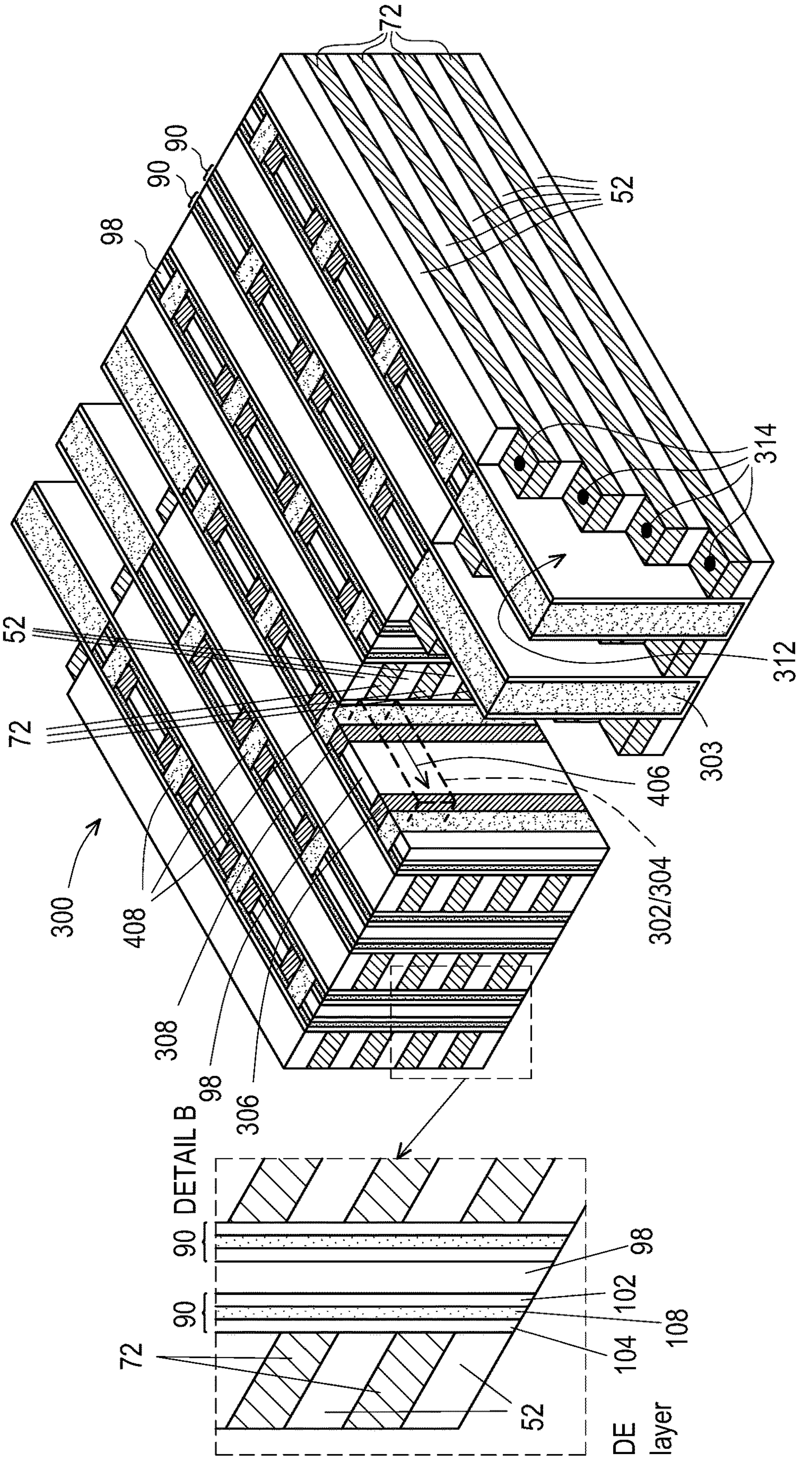
FIGS. 8A and 8B diagrammatically illustrate a perspective view and a circuit diagram of a memory array in accordance with some embodiments disclosed herein.
Figure 8B:
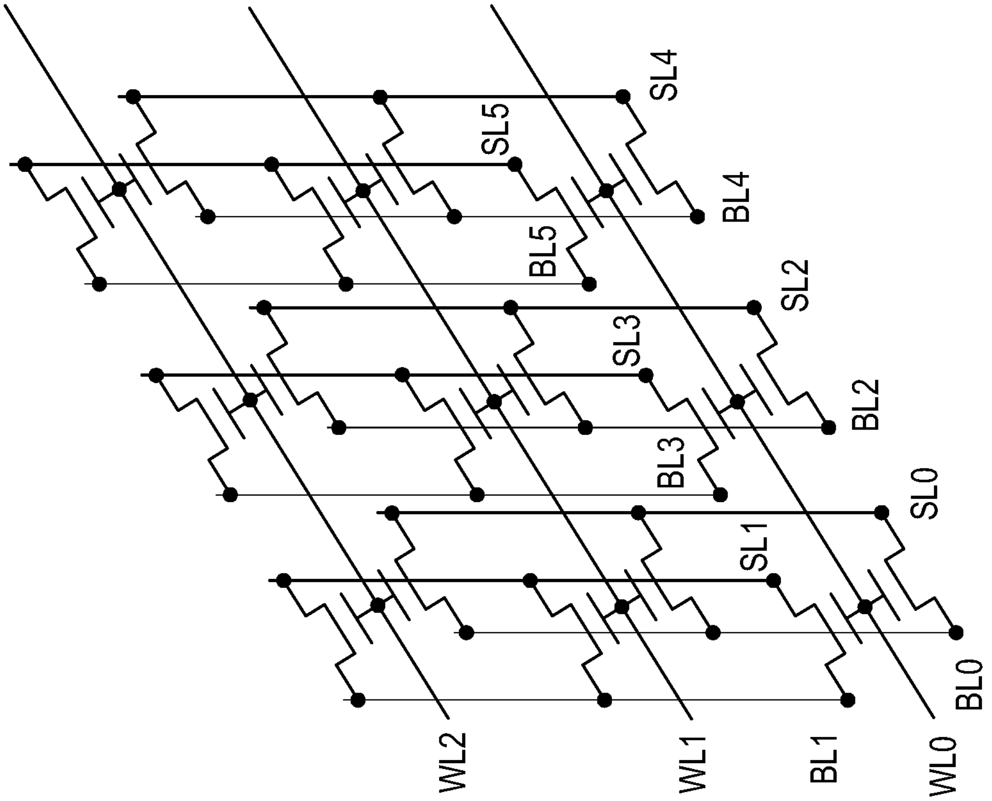

FIGS. 8A and 8B illustrate a memory array 300 according to some other suitable embodiments. FIG. 8A illustrates a portion of the memory array 300 in a three-dimensional perspective view, and FIG. 8B illustrates a circuit diagram of the memory array 300. As shown, the memory array 300 includes a plurality of memory cells 302, which may be arranged in a grid of rows and columns. Each memory cell 302 includes a Fe/AFe FET with the layer structure of the planar Fe/AFe FET of FIG. 1A, but with the Fe/AFe FETs of the embodiment of FIGS. 8A and 8B implemented in a complex three-dimensional (3D) array with word lines 72 electrically connected with or forming the gate electrodes of the Fe/AFe FETs, bit lines 306 electrically connected with or forming the drain regions of the Fe/AFe FETs, and source lines 308 electrically connected with or forming the source regions of the Fe/AFe FETs. To provide addressability of individual memory cells 302, the word lines (or, more generally, conductive lines) 72 are spaced apart from one another by intervening insulator material 52, and the bit lines 306 and source lines 308 are spaced apart from one another by insulator material 98. The Fe/AFe FET units are fabricated as multilayer structures 90 in electrical contact with the bit lines 306, source lines 308, and word lines 72. Detail B of FIG. 8A provides an enlarged view of a portion of the array 300 illustrating the multilayer structures in enlarged view, Each multilayer structure 90 includes a memory film or layer 104 comprising a ferroelectric material with Fe and AFe domains, a depolarization dielectric layer 108 disposed on (e.g. in contact with) the memory film or layer 104, and an oxide semiconductor layer 102 forming the channel of the memory cell 302, As previously discussed, the memory film or layer 104 may, for example, comprise HZO or another type of ferroelectric material such as $SrBi_2\ Ta_2O_9$, $PbZr_xTi_{1-x}O_3$, or $BaTiO_3$. The depolarization dielectric layer 108 may for example comprise $Al_2O_3$, $HfO_2$, $ZrO_2$, combination thereof or the like. The oxide semiconductor layer 102 may for example comprise ZnO, InWO, InGaZnO, InZnO, ITO, combination thereof or the like. The illustrative multilayer structure 90 of the Fe/AFe units of the embodiment of FIG. 8A is seen to have a layer order corresponding to that of the planar Fe/AFe transistor 100 of the embodiment of FIG. 1A, that is, starting with the gate (corresponding in FIG. 8A to the word line 72), the ferroelectric memory film or layer 104 is disposed on the gate/word line 72; the depolarization dielectric layer 108 is disposed on the ferroelectric memory film or layer 104, and the oxide semiconductor 102 is disposed on the depolarization dielectric layer 108. However, it will be appreciated that the illustrative stack 90 could be replaced by one of the alternative stack designs of FIG. 2 (where the depolarization dielectric layer 108 is interposed between the gate/word line 72 and the ferroelectric memory film or layer 104) or FIG. 4 (where there are two depolarization dielectric layers 108 disposed on respective sides of the ferroelectric memory film or layer 104). As in previously described embodiments, the inclusion of the depolarization dielectric layer or layers provides advantages such as improved switching from the PRG state to the ERS state and/or lower biasing or switching voltage as compared to when no depolarization dielectric layer is employed. The memory cells 302 are arranged as two-dimensional (2D) arrays that in turn are stacked vertically to provide the 3D memory array, thereby increasing device density. The memory array 300 may be formed during BEOL processing of a semiconductor die. For example, the memory array 300 may be disposed in the interconnect layers of the semiconductor die, such as above one or more active devices (for example, transistors) formed on a semiconductor substrate.

In some suitable embodiments, the memory array 300 is a flash memory array, such as a NOR flash memory array or the like. Suitably, and as best seen in Detail B of FIG. 8A, each of the memory cells 302 includes a transistor 304 (for example, such as the Fe/AFe-FET 100) with a memory structure or layer stack 90 (for example, including the memory film or layer 104 and accompanying depolarization dielectric layer 108, and the oxide semiconductor layer 102). The memory film or layer 104) serves as a gate dielectric that spaces apart the gate electrode (corresponding to word line 72) from the transistor channel corresponding to the oxide semiconductor 102. In each Fe/AFE-FET transistor 304, a gate is implemented as a respective word line (for example, a conductive line 72), a source region is implemented via a respective bit line (for example, a conductive line 306), and a drain region is implemented via a respective source line (for example, a conductive line 308), which in some embodiments electrically couples the drain region to ground. As shown, the memory cells 302 in a same horizontal row of the memory array 300 may share a common word line 72, while the memory cells 302 in a same vertical column of the memory array 300 may share a common source line 308 and a common bit line 306.

As shown, the memory array 300 includes a plurality of vertically stacked conductive lines 72 (for example, which are shown as word lines WL0, WL1 and WL2 in the circuit diagram of FIG. 8B) with dielectric layers 52 disposed between adjacent ones of the conductive lines 72. In some suitable embodiments, the conductive lines 72 extend in a direction parallel to a major surface of an underlying substrate (not separately illustrated in FIGS. 8A and 8B). To permit electrical contact to the word lines 72, as seen in the main drawing of FIG. 8A the portions of the array may be processed, e.g. by etching, to expose ends of successive conductive lines 72 in a staircase configuration 312 such that lower conductive lines 72 are longer than and extend laterally past endpoints of upper conductive lines 72. FIG. 8A also diagrammatically indicates landings 314 for contact vias (not shown in FIG. 8A) formed later in the BEOL processing to contact the respective ends of the word lines 72 along the staircase 312. For example, in FIG. 8A, multiple, stacked layers of conductive lines 72 are illustrated with topmost conductive lines 72 being the shortest and bottommost conductive lines 72 being the longest. Respective lengths of the conductive lines 72 may increase in a direction towards the underlying substrate. In this manner, a portion of each of the conductive lines 72 may be accessible from above the memory array 300, and conductive contacts may be made to contact an exposed portion of each of the conductive lines 72.

In accordance with some suitable embodiments, the memory array 300 further includes a plurality of conductive lines 306 (for example, which are shown as bit lines BL0, BL1, BL2, BL3, BL4 and BL5 in the circuit diagram of FIG. 8B) and a plurality of conductive lines 308 (for example, which are shown as source lines SL0, SL1, SL2, SL3, SL4 and SL5 in the circuit diagram of FIG. 8B). Suitably, the conductive lines 306 and the conductive lines 308 may each extend in a direction perpendicular to the conductive lines 72. In some suitable embodiments, dielectric materials 98 are disposed between and isolate adjacent ones of the conductive lines 306 and the conductive lines 308. In practice, pairs of the conductive lines 306 and the conductive lines 308 along with an intersecting conductive line 72 may define boundaries of each memory cell 302, and dielectric materials 303 may disposed between and isolate adjacent pairs of the conductive lines 306 and the conductive lines 308. In some suitable embodiments, the conductive lines 308 may be electrically coupled to ground. Although FIG. 8A illustrates a particular placement of the conductive lines 306 relative to the conductive lines 308, it should be appreciated that the placement of the conductive lines 306 and the conductive lines 308 may be flipped.

the multilayer stacks 90 of the memory array 300 include the oxide semiconductor (OS) layer 102. The oxide semiconductor layer 102 provides the channel regions for the transistors 304 of the memory cells 302. For example, when an appropriate voltage (i.e., higher than a respective threshold voltage (Vth) of a corresponding transistor 304) is applied through a corresponding conductive line 72, a region of the oxide semiconductor layer 102 that intersects the conductive line 72 may allow current to flow from the conductive lines 306 to the conductive lines 308 (for example, in the direction indicated by arrow 406, i.e. the channel direction). Along the channel direction 406, neighboring transistors 304 are electrically isolated from one another by isolation material 408.

As best seen in Detail B of FIG. 8A, in the illustrative embodiment, the ferroelectric memory layer or film 104 and depolarization dielectric layer 108 are disposed between the conductive lines 72 and the oxide semiconductor (OS) layer 102, and the memory layer or film 104 (and accompanying depolarization dielectric layer 108) provide gate dielectrics for the transistors 304. As the memory structure or layer stack 90 comprises the memory film or layer 104 as described herein, the memory array 300 may be referred to as a Fe/AFe random access memory (Fe/AFe-RAM) array.

In some suitable embodiments, the memory film or layer 104 may be polarized in one of two different directions. In practice, the polarization direction may be changed by applying an appropriate voltage differential across the memory structure or layer stack 90 and generating an appropriate electric field. Suitably, this polarization may be relatively localized (for example, generally contained within each boundaries of the memory cells 302) and continuous regions of the memory structure or layer stack 90 may extend across a plurality of memory cells 302. Depending on a polarization direction of a particular region of the memory film or layer 104, a threshold voltage of a corresponding transistor 304 varies and a digital value (for example, a 0 or a 1) can be stored. For example, when a region of the memory film or layer 104 has a first electrical polarization direction, the corresponding transistor 304 may have a relatively low threshold voltage, and when the region of the memory film or layer 104 has a second electrical polarization direction, the corresponding transistor 304 may have a relatively high threshold voltage. Suitably, the difference between the two threshold voltages may be referred to as the threshold voltage shift. Advantageously, a larger threshold voltage shift makes it easier (for example, less error prone) to read the digital value stored in the corresponding memory cell 302.

In accordance with some suitable embodiments, to perform a write operation on a memory cell 302, a write voltage is applied across a portion of the memory structure or layer stack 90 corresponding to the memory cell 302. Suitably, the write voltage can be applied, for example, by applying appropriate voltages to a corresponding conductive line 72 (for example, a corresponding word line) and the corresponding conductive lines 306 and conductive lines 308 (for example, corresponding bit and source lines). By applying the write voltage across the portion of the memory film or layer 104, a polarization direction of the region of the memory film or layer 104 can be changed. As a result, the corresponding threshold voltage of the corresponding transistor 304 can be switched from a low threshold voltage to a high threshold voltage or vice versa and a digital value can be stored in the memory cell 302. Because the conductive lines 72 intersect the conductive lines 306 and the conductive lines 308, individual memory cells 302 may be selected for the write operation.

In accordance with some suitable embodiments, to perform a read operation on the memory cell 302, a read voltage (for example, a voltage between the low and high threshold voltages) is applied to the corresponding conductive line 72 (for example, the corresponding word line). Depending on the polarization direction of the corresponding region of the memory film or layer 104, the transistor 304 of the memory cell 302 may or may not be turned on. As a result, the corresponding conductive line 306 may or may not be discharged through the corresponding conductive line 308 (for example, the corresponding source line that is coupled to ground), and the digital value stored in the memory cell 302 can be determined. Because the conductive lines 72 intersect the conductive lines 306 and the conductive lines 308, individual memory cells 302 may be selected for the read operation.

In accordance with some suitable embodiments, FIGS. 9A-9K shows by way of successive diagrammatic perspective views of the in-fabrication memory array, a method and/or process for manufacturing and/or fabricating a memory array, for example such as the memory array 300.

Figure 9C:
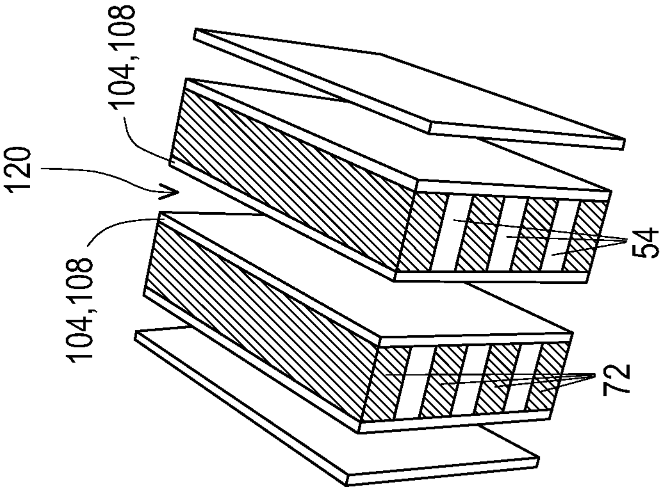
FIGS. 9A-9K are a series of successive diagrammatic perspective views showing a method of manufacturing a memory array, for example, such as the one shown in FIGS. 8A and 8B, in accordance with some embodiments disclosed herein.
Figure 9B:
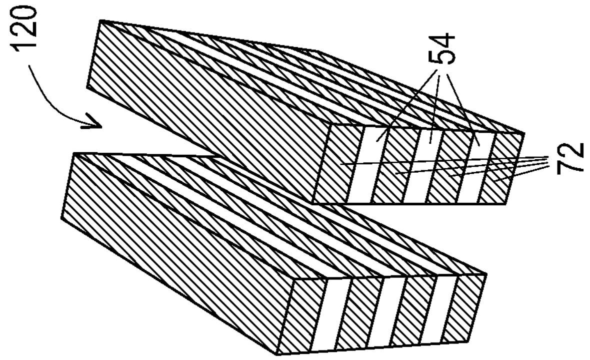
Figure 9A:
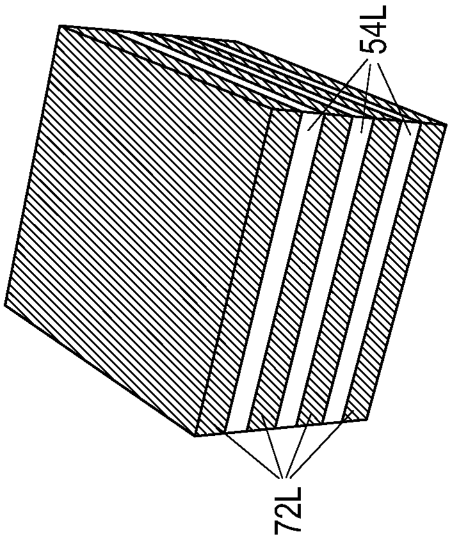

Suitably, the process may begin as shown in FIG. 9A with a channel stack including alternating layers of an isolation material 54L (for example, such as a suitable oxide, silicon nitride (SiN), or other suitable isolation material, which will ultimately serve as the dielectric layers 52) and a metal or dielectric material 72L (for example, such as a suitable oxide or SiN or other suitable dielectric material, which is different than the aforementioned isolation material and will ultimately serve as the conductive lines 72). Suitably, the foregoing alternating layers may comprise and/or be referred to as an epitaxial (EPI) stack.

Next as shown in FIG. 9B, in accordance with some suitable embodiments, trenches 120 are etched in the foregoing EPI stack of alternating layers 54L, 72L, to form the word lines 72 and spacing dielectric material 54. As next shown in FIG. 9C, the memory structure 104, 108 including the memory film or layer 104 and the depolarization dielectric layer 108 are deposited and/or otherwise formed in the aforementioned trenches 120, for example. In practice, step 1006 may include the successive depositing and/or forming, for example, of both the memory film or layer 104 and the depolarization dielectric layer 108. Depending on the order of deposition of the memory film or layer 104 and the depolarization dielectric layer 108, the memory structure 104, 108 may have the configuration of FIG. 1A (by depositing the memory film or layer 104 followed by the depolarization dielectric layer 108); or may have the configuration of FIG. 3 (by depositing the depolarization dielectric layer 108 followed by the memory film or layer 104) or may have the configuration of FIG. 4 (by depositing a first depolarization dielectric layer 108 followed by the memory film or layer 104 followed by a second depolarization dielectric layer 108).

Figure 9D:
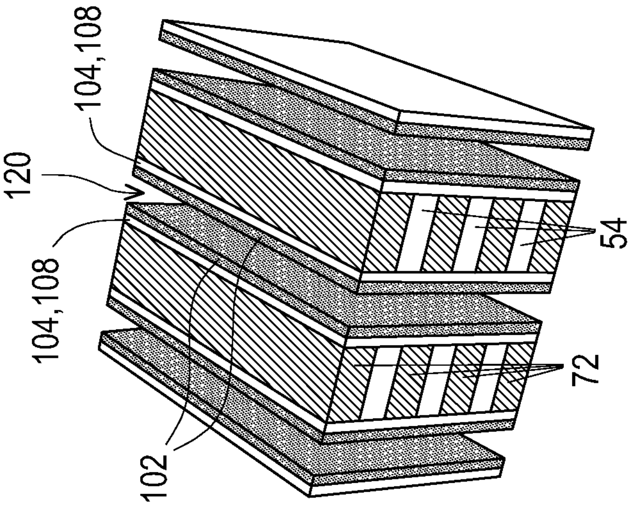
Figure 9E:
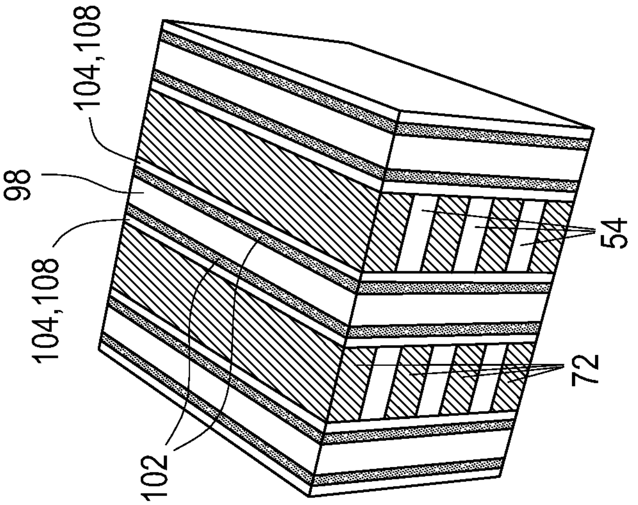
Figure 9F:
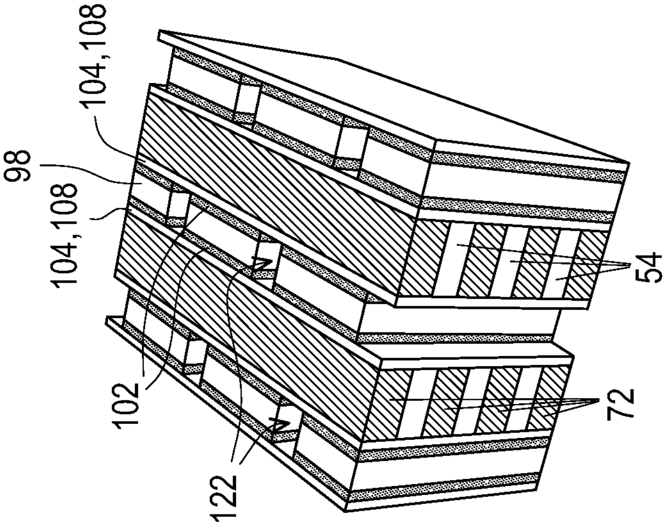
Figure 9I:
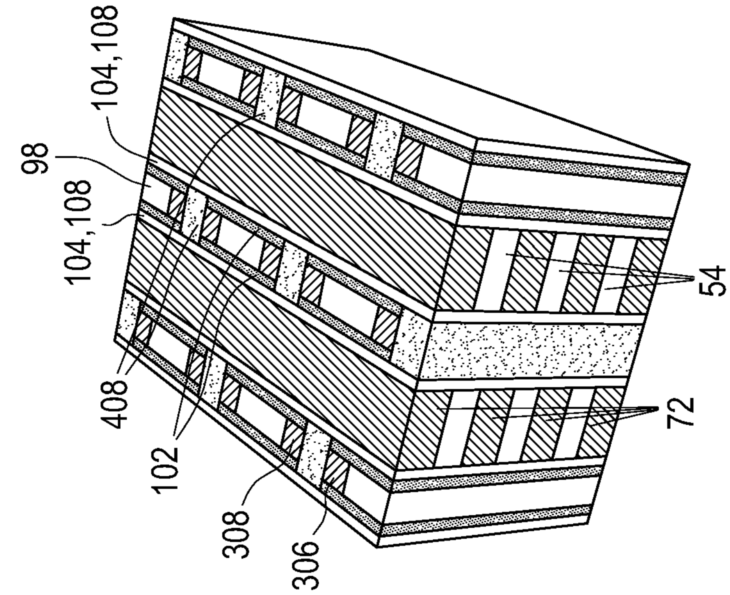

Next, as shown in FIG. 9D, the oxide semiconductor layer 102 is deposited and/or formed in the trenches 120, for example, adjacent to, covering, in contact with, and/or otherwise proximate the memory structure 104, 108. As shown in FIG. 9E, the remainder of the trenches are filled with the insulator material 98, for example, without limitation, with an oxide or SiN or the like. Next, as shown in FIG. 9F, portions of the aforementioned filler insulator material 98 and oxide semiconductor layer 102 are etched to form openings 122. As shown in FIG. 9G, the openings 122 are filled with a suitable isolation material 408, for example, such as an oxide or SiN or the like, which will ultimately serve to isolate neighboring transistors 304 along the channel direction 406 as discussed with reference to FIG. 8A.

Figure 9H:
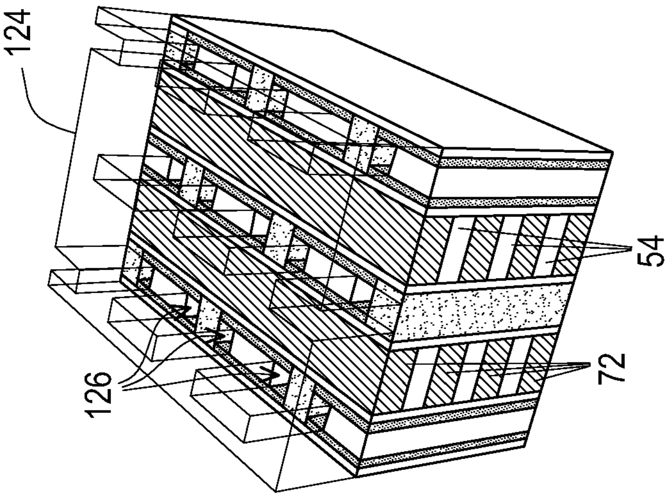
Figure 9G:
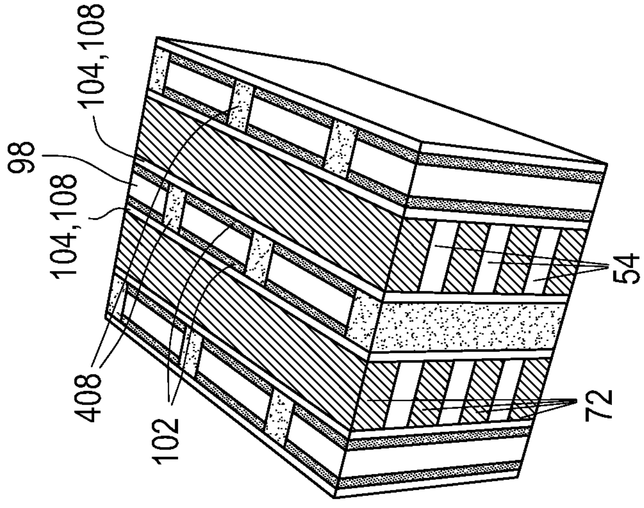
Figure 9J:
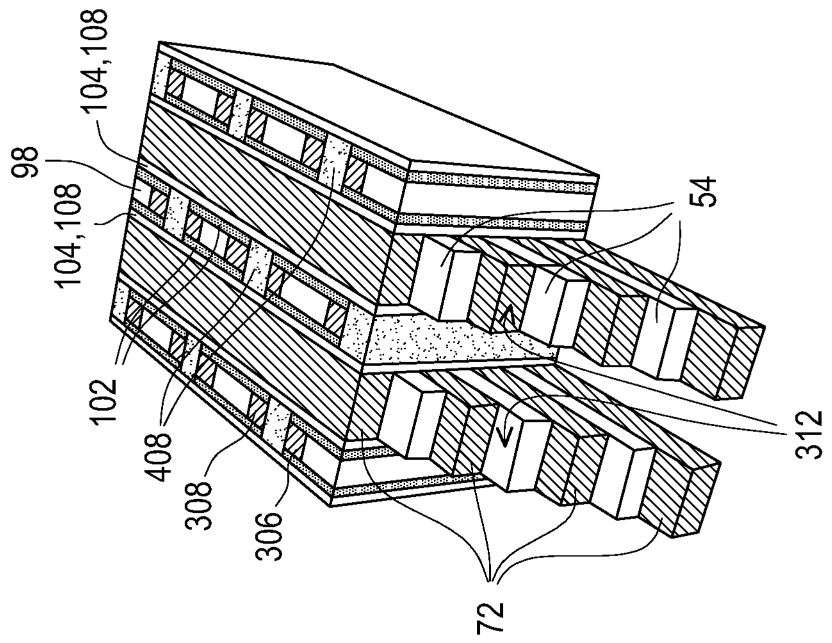
Figure 9K:
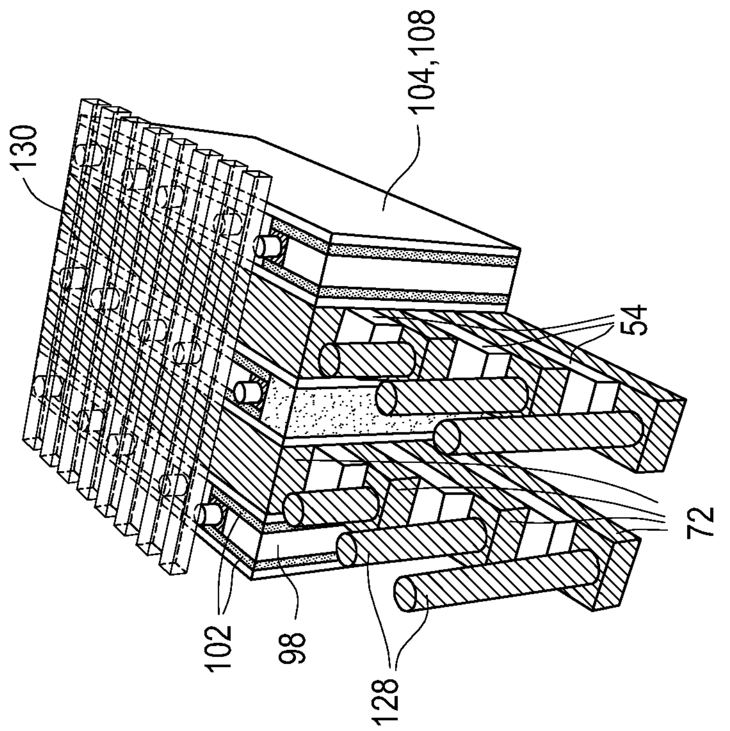

With reference to FIG. 9H, a suitable mask 124 and/or self-aligning process may be employed to etch openings 126 to accommodate the bit lines 306 and source lines 308. FIG. 9I then illustrates the bit lines 306 and source lines 308 formed by filling the openings 126. That is, the openings 126 are filled to create the bit lines 306 and source lines 308. In some embodiments, the bit line and/or source line structures 306, 308 are formed from a suitable metal or other suitably electrically conductive material, for example, without limitation, such as, tungsten (W), titanium (Ti), titanium nitride (TIN), tantalum nitride (TaN), combinations and/or alloys thereof or the like. With reference to FIG. 9J, the staircase structures 312 are formed, for example by a suitable etching and/or other material removal process. With reference to FIG. 9K, contact vias 128 are formed to contact the landings 314 of the staircase 312 (see FIG. 8A) provide electrical connections to the word lines 72, and further metallization layers 130 are formed during BEOL processing to electrically connect with the respective word lines 72, source lines 308 and bit lines 306.

In addition to the fabrication steps outlined above with reference to FIGS. 9A-9K, the formation process for forming the memory array 300 may include a thermal annealing step to produce ferroelectric crystallization of the memory film or layer 104, e.g. to convert a suitable portion of HZO, as an example, to ferroelectric orthorhombic phase as previously described with reference to the process of FIGS. 1B-1F. The anneal can in general be performed at a point in the process after the stage shown in FIG. 9C, that is, after the formation of the memory structures 104, 108.

In the following, some further illustrative embodiments are described.

In some embodiments, a field-effect transistor (FET) device, selectively switchable between a first state and a second state, comprises: source and drain regions; a channel region disposed between the source and drain regions; a gate arranged to selectively receive a bias voltage to selectively switch the FET between the first state and the second state; a memory structure disposed between the gate and the channel region, the memory structure including a first portion which is anti-ferroelectric and a second portion which is ferroelectric, the first and second portions being polarized in a first direction when the FET is in the first state; and at least one depolarization dielectric layer disposed proximate to the memory structure. In some embodiments, when the FET is set to the first state, the at least one depolarization dielectric layer operates to destabilize a polarization of at least the second portion of the memory structure while maintaining a polarization of the first portion of the memory structure.

In some further embodiments, the at least one depolarization dielectric layer operates to destabilize the polarization of at least the second portion of the memory structure by creating an electric field in a direction opposite the first direction.

In still additional embodiments, when the FET is set to the second state, at least the first portion of the memory structure is, in an aggregate, unpolarized.

In some embodiments, when the FET is set to the second state, the at least one depolarization dielectric layer does not operate to polarize the first portion of the memory structure.

In yet further embodiments, the memory structure comprises a film of hafnium zirconium oxide (HZO), having a percentage of zirconium (Zr) in a range of between 50% and 80%, inclusive.

In some further embodiments, the first portion comprises a tetragonal phase (T-phase) crystalline portion of the HZO film and the second portion comprises an orthorhombic phase (O-phase) crystalline portion of the HZO film.

In some embodiments, the T-phase crystalline portion is in a range of between 2% and 14% of the HZO film, inclusive; and the O-phase crystalline portion is in a range of between 84% and 88% of the HZO film, inclusive.

In yet further embodiments, the memory structure comprises an at least partially anti-ferroelectric film having a thickness in a range of between 2 nanometers (nm) and 20 nm, inclusive.

In some embodiments, the at least one depolarization dielectric layer comprises at least one of aluminum oxide ($Al_2O_3$), hafnium oxide ($HfO_2$) and zirconium oxide ($ZrO_2$).

In some further embodiments, the at least one depolarization dielectric layer has a thickness in a range of between 0.1 nanometers (nm) and 2 nm, inclusive.

In still further embodiments, an oxide semiconductor (OS) layer serves as the channel region.

In yet additional embodiments, the at least one depolarization dielectric layer is disposed between the channel region and the memory structure.

In some further embodiments, the at least one depolarization dielectric layer is disposed between the memory structure and the gate.

In some additional embodiments, the at least one depolarization dielectric layer includes two depolarization dielectric layers each disposed on opposite sides of the memory structure.

In some embodiments, a three-dimensional (3D) memory array includes a plurality of electrically conductive word lines, a plurality of electrically conductive bit lines and electrically conductive source lines, and an array of memory cells. The electrically conductive bit lines and electrically conductive source lines are perpendicular to the electrically conductive word lines. Each memory cell includes a channel region electrically connected between one of the electrically conductive source lines and one of the electrically conductive bit lines, a memory film disposed between one of the electrically conductive word lines and the channel region, the memory film including a first anti-ferroelectric domain and a second ferroelectric domain, the first anti-ferroelectric domain and the second ferroelectric domain being polarized in a first direction when the memory cell is switched to the first state, and a depolarization dielectric layer arranged on at least one side of the memory film. When the memory cell is set to the first state, the depolarization dielectric layer creates an electric field which weakens a polarization of the ferroelectric domain of the memory film while maintaining a polarization of the anti-ferroelectric domain of the memory film.

In some embodiments, a magnitude of the electric field is proportional to a voltage drop ($V_{DE}$) across the depolarization dielectric layer resulting from an application of the bias voltage divided by a thickness of the depolarization dielectric layer, and the thickness of the depolarization dielectric layer is established such that $V_{DE}$ falls between a first control voltage associated with the first anti-ferroelectric domain of the memory film and a second control voltage associated with the second ferroelectric domain, the first control voltage being greater than the second control voltage.

In some further embodiments, $V_{DE}$ is closer to the second control voltage than the first control voltage.

In still further embodiments, the thickness of the depolarization dielectric layer is in a range of between 0.1 nanometers (nm) and 2 nm, inclusive.

In yet further embodiments, a method of manufacturing a field-effect transistor (FET) includes: forming a source region; forming a drain region; forming a channel region between the source region and the drain region; forming a gate arranged to selectively receive a bias voltage which selectively switches the FET between a first program state and a second erase state; forming an anti-ferroelectric/ferroelectric layer between the gate and the channel region, the anti-ferroelectric/ferroelectric layer including an anti-ferroelectric portion and a ferroelectric portion, the portions both being polarized in a first direction when the FET is switched to the program state; and forming a depolarization dielectric layer arranged on at least one side of the anti-ferroelectric/ferroelectric layer. Suitably, when the FET is set to the program state by a selective application of the bias voltage at a first magnitude to the gate, the depolarization dielectric layer acts to undermine a polarization of the ferroelectric portion without undermining a polarization of the anti-ferroelectric portion.

In still one more embodiment, when the FET is set to the erase state by a selectively application of the bias voltage at a second magnitude to the gate, the anti-ferroelectric portion is, on a whole, unpolarized.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A field-effect transistor (FET) device selectively switchable between a first state and a second state, the FET comprising:

source and drain regions;

a channel region disposed between the source and drain regions;

a gate arranged to selectively receive a bias voltage to selectively switch the FET between the first state and the second state;

a memory structure disposed between the gate and the channel region, the memory structure including a first portion which is anti-ferroelectric and a second portion which is ferroelectric, the first and second portions being polarized in a first direction when the FET is in the first state; and at least one depolarization dielectric layer disposed proximate to the memory structure, wherein, when the FET is set to the first state, the at least one depolarization dielectric layer operates to destabilize a polarization of at least the second portion of the memory structure which is ferroelectric while maintaining a polarization of the first portion of the memory structure which is anti-ferroelectric.

2. The FET device of claim 1, wherein the at least one depolarization dielectric layer operates to destabilize the polarization of at least the second portion of the memory structure by creating an electric field in a direction opposite the first direction.

3. The FET device of claim 1, wherein, when the FET is set to the second state, at least the first portion of the memory structure is, in an aggregate, unpolarized.

4. The FET device of claim 3, wherein, when the FET is set to the second state, the at least one depolarization dielectric layer does not operate to polarize the first portion of the memory structure.

5. The FET device of claim 1, wherein the memory structure comprises a film of hafnium zirconium oxide (HZO), having a percentage of zirconium (Zr) in a range of between about 50% and about 80%, inclusive.

6. The FET device of claim 5, wherein the first portion comprises a tetragonal phase (T-phase) crystalline portion of the HZO film and the second portion comprises an orthorhombic phase (O-phase) crystalline portion of the HZO film.

7. The FET device of claim 6, wherein the T-phase crystalline portion is in a range of between about 2% and about 14% of the HZO film, inclusive; and the O-phase crystalline portion is in a range of between about 84% and about 88% of the HZO film, inclusive.

8. The FET device of claim 1, wherein the at least one depolarization dielectric layer comprises at least one of aluminum oxide ($Al_2O_3$), hafnium oxide ($HfO_2$) and zirconium oxide ($ZrO_2$).

9. The FET device of claim 1, wherein the at least one depolarization dielectric layer has a thickness of about 2 nm or less.

10. The FET device of claim 1, wherein the channel region comprises an oxide semiconductor layer.

11. The FET device of claim 1, wherein the at least one depolarization dielectric layer is disposed between the channel region and the memory structure.

12. The FET device of claim 1, wherein the at least one depolarization dielectric layer is disposed between the memory structure and the gate.

13. The FET device of claim 1, wherein the at least one depolarization dielectric layer includes two depolarization dielectric layers each disposed on opposite sides of the memory structure.

14. A three-dimensional memory array comprising:
- a metallization including patterned metal layers spaced apart by intermetal dielectric material (IMD) and interlayer vias passing through the IMD and interconnecting the patterned metal layers; and
- a stack of FET layers spaced apart by the IMD, each FET layer comprising a two-dimensional array of FET devices electrically connected with the metallization;
- wherein each FET device includes:
  - source and drain regions;
  - a channel region disposed between the source and drain regions;
  - a gate arranged to selectively receive a bias voltage to selectively switch the FET between the first state and the second state;
  - a memory structure comprising a film of hafnium zirconium oxide (HZO) having a percentage of zirconium (Zr) in a range of between about 50% and about 80% inclusive disposed between the gate and the channel region, the memory structure including a first portion which is anti-ferroelectric and a second portion which is ferroelectric, the first and second portions being polarized in a first direction when the FET is in the first state; and
  - at least one depolarization dielectric layer comprising aluminum oxide ($Al_2O_3$) disposed in contact with the memory structure.

15. A three-dimensional memory array comprising:
- a three dimensional array of FET devices as set forth in claim 1;
- wherein the gates of the FET devices comprise electrically conductive word lines and the source regions comprise electrically conductive source lines and the drain regions comprise electrically conductive bit lines;
- wherein the electrically conductive source lines and the electrically conductive bit lines are perpendicular to the electrically conductive word lines.

16. A three-dimensional (3D) memory array comprising:
- a plurality of electrically conductive word lines;
- a plurality of electrically conductive bit lines and electrically conductive source lines, the electrically conductive bit lines and electrically conductive source lines being perpendicular to the electrically conductive word lines; and
- an array of memory cells, each memory cell including:
  - an oxide semiconductor channel region electrically connected between one of the electrically conductive source lines and one of the electrically conductive bit lines;
  - a memory film disposed between one of the electrically conductive word lines and the oxide semiconductor channel region, the memory film including a first plurality of anti-ferroelectric domains and a plurality of ferroelectric domains, the plurality of anti-ferroelectric domains and the plurality of ferroelectric domains each being polarized in a first direction when the memory cell is switched to the first state; and
  - a depolarization dielectric layer arranged on at least one side of the memory film;
- wherein, when the memory cell is set to the first state, the depolarization dielectric layer creates an electric field which weakens a polarization of the ferroelectric domains of the memory film while maintaining a polarization of the anti-ferroelectric domains of the memory film.

17. The 3D memory array of claim 16, wherein a magnitude of the electric field is proportional to a voltage drop ($V_{DE}$) across the depolarization dielectric layer resulting from an application of the bias voltage divided by a thickness of the depolarization dielectric layer, and the thickness of the depolarization dielectric layer is established such that $V_{DE}$ falls between a first control voltage associated with the anti-ferroelectric domains of the memory film and a second control voltage associated with the ferroelectric domains, the first control voltage being greater than the second control voltage.

18. The three-dimensional memory array of claim 14, wherein:
- the channel region comprises an oxide semiconductor layer; and
- the at least one depolarization dielectric layer has a thickness of about 2 nm or less.

19. The FET device of claim 1, wherein;
- the memory structure comprises a memory film,
- the first portion of the memory film which is anti-ferroelectric comprise anti-ferroelectric grains of the memory film, and
- the second portion of the memory film which is ferroelectric comprises ferroelectric grains of the memory film.

20. The 3D memory array of claim 16, wherein the anti-ferroelectric domains comprise anti-ferroelectric grains of the memory film, and the ferroelectric domains comprise ferroelectric grains of the memory film.

* * * * *